CIRCUIT FOR COMPATIBLE TANDEM CONNECTION
OF THERMOELECTRIC COUPLES

Filed June 22, 1964

INVENTOR.
NILS E. LINDENBLAD

BY

J. F. Skehan
ATTORNEY 3,359,139
CIRCUIT FOR COMPATIBLE TANDEM CONNECTION OF THERMOELECTRIC COUPLES Nils E. Lindenblad, Princeton, N.J., assignor, by mesne assignments, to the United States of America as represented by the Secretary of the Navy Filed June 22, 1964, Ser. No. 377,145
1 Claim. (Cl. 136—205)

ABSTRACT OF THE DISCLOSURE

Thermoelectric apparatus providing for continuous thermal and electrical flow over a wide temperature range which is formed of a first thermocouple having metal elements which operate effectively in the higher temperature range and have adjacent ends interconnected by a heat input conductor. The other end of one element of the first thermocouple is then joined to the thermocouple elements of a second thermocouple by means of a first thermal and electrical conductor and the other end of the other element of the first thermocouple is joined to the elements of a third thermocouple by means of a second thermal and electrical conductor. The elements of the second and third thermocouple are selected to operate effectively in a lower temperature range and elements of the second and third thermocouples are bridged by means of a third thermal and electrical conductor which provides a common heat sink for these thermocouples.

This invention relates to thermoelectric devices or systems and in particular concerns such a device or system which is formed of a plurality of thermocouples and so arranged as to provide for the efficient flow of heat and electric current with the resultant optimum performance.

It is well known in the art that when a direct current is passed through a circuit having coupled or paired materials of dissimilar thermoelectric properties, one junction between the coupled materials becomes cool and absorbs heat, while the other junction between the materials becomes hot and releases heat. Such circuits are thermocouples and the phenomenon of heat absorption and heat release is known as the Peltier effect. Thermoelectric phenomena are reversible, so that a temperature difference between two locations on a thermoelectric material, will cause heat to flow from the higher temperature area to the lower, and will by the related transport of electric charge produce an electric potential difference between the two said areas. This is called the Seebeck effect. It is thus clear that in principle one can consider a thermoelectric device as either useful as a heat pump or as an energy converter.

In the prior thermocouple art, materials having dissimilar thermoelectric properties are usually designated by the letters P and N which is acceptable nomenclature for convenience in differentiating the materials. An N type material is considered one which includes an abundance of electrons, while a P type material includes an abundance of electron vacancies or holes and current flow is from the N type material to the P type.

Generally, thermoelectric materials exhibit their greater effectiveness within particular temperature ranges which are distinctly individual with or characteristic of a material. Optimum operation should be expected when thermocouple materials are selected to mutually coact that is, so selected as to be effective in a total temperature zone which is of greater range than that which a single material is capable of being effective. A practical solution is to arrange a plurality of thermocouples in the zone of operation to, in effect, divide the zone into a plurality of temperature stages which vary progressively and to select the materials for each stage so that each has optimum performance in its particular temperature stage.

When such thermocouples are formed into a unit and the input heat is supplied to the thermocouples in the highest temperature stage, a portion is converted to electricity and the remaining heat passes from the low temperature terminal of that thermocouple to the high temperature terminal of the next adjacent thermocouple which operates in the adjacent lower temperature stage where more electricity is formed. The number of stages being determined in accordance with the materials selected for the thermocouples.

The characteristics of the materials selected for the thermocouples may, however, differ sufficiently to make operating at the same electric current, i.e., in direct series connection, incompatible with an effective additive or cumulative production of electricity. A high temperature stage material may, for example, have a higher specific heat conductivity than that of a particular low temperature stage material although their specific electrical resistances may be comparable. Thus, in order to achieve sufficient temperature drop through the high temperature stage material to match up with the temperature required by a lower temperature stage material, it may require that the high temperature stage material have such a large ratio of length to cross-section that its resistance would be out of proportion with that of the low temperature stage material. Since the temperature division between the two materials must be maintained, one solution to the problem is to draw a smaller current from the high temperature stage material than from the low temperature stage material but to accomplish this the two stages can no longer be connected in simple series arrangement but must be electrically separated. However, even a very thin partition of such very good heat conducting but electrically insulating material such as some aluminae or beryllium will introduce a considerable temperature gradient with consequent loss.

The principal object of this invention is to overcome these difficulties in a more practical and more efficient way by providing a unique circuit which permits operation of such a plurality of thermocouples without resort to insulating partitions.

Another object is to so relatively arrange the dissimilar thermocouple materials as to permit the bonding of the thermocouples in a manner to provide continuity of electrical and thermal flow.

Another object is to select the dissimilar components of a plurality of thermocouples so that each thermocouple is effective over a limited range or stage of a wider temperature range and arranging the themocouple in tandem for operation over the wide temperature range.

Another object is to establish a general relationship between or among the thermocouples by varying the ratios between the length and cross section of the thermocouple materials to provide effective and direct heat and current flow.

For a better understanding of the invention, reference may be had to the accompanying drawings wherein.

Figure 1:
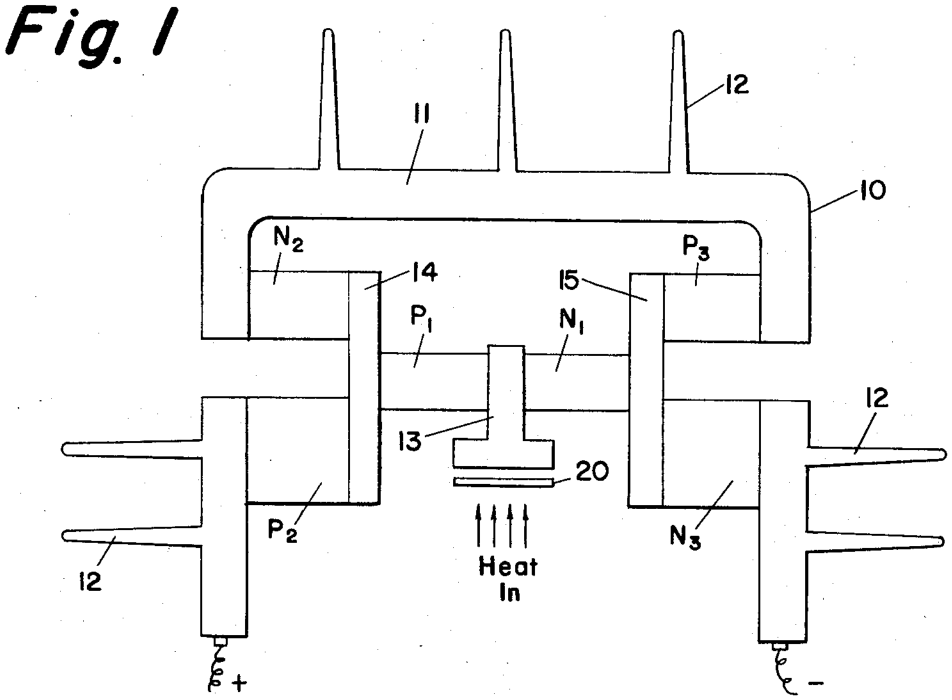
FIGURE 1 represents one arrangement of a multiple thermocouple circuit of the invention.

Referring to FIGURE 1, the thermoelectric device or system is indicated generally at 10 and is formed of a thermally and electrically conductive metal heat sink 11, such as copper within which the thermocouples are located. Preferably, as shown, the heat sink 11 for the thermocouples is provided with fins 12 for the dissipation of heat and the thermocouples arranged to form a unitary structure with the heat sink 11.

Three thermocouples are shown, each being formed with one P type metal and one N type metal. One thermocouple is disposed centrally of the heat sink 11 and is indicated at $P_1$–$N_1$ which represent metals that are selected for effective operation at the highest temperature stage of a total or wider temperature range or zone formed by the structure of the heat sink 11. The $P_1$–$N_1$ metals are joined, for example, by a heat conductor 13 through which the input heat is supplied. At the left of the figure a second thermocouple is located and is comprised of dissimilar metals $P_2$–$N_2$ which are spaced from each other and are selected for effective operation in a lower temperature stage of the total temperature range while a third thermocouple is located at the right side of the figure and identified by $P_3$–$N_3$ representing dissimilar metals which also are spaced from each other and effectively operate in the lower temperature range or stage. The $P_2$–$N_2$ and the $P_3$–$N_3$ thermocouple components are joined, for example, by metal bars 14 and 15 which are both heat and electrically conductive. It will be understood that the higher and lower temperature stages may overlap and that the lower temperature end of the $P_1$–$N_1$ thermocouples will overlap the higher temperature ends of the $P_2$–$N_2$–$P_3$–$N_3$ thermocouples.

The thermocouple components $P_1$–$N_1$ in the higher temperature stage have a greater ratio between their length and cross section than the ratio between the length and cross section of either of the components $P_2$–$N_2$ or $P_3$–$N_3$ in the lower temperature stages. The components $P_2$–$N_3$ of the lower temperature stage couples have the smallest ratio between length and cross section and these carry current which is the sum of the current of the next larger components $N_2$–$P_3$ and the largest components $P_1$–$N_1$. Consequently, by regulating the parameters such as length and cross sections of the low temperature materials, the current ratio, or current difference, between the two components in the lower temperature stages, the parameters of the materials or components in the higher temperature stage may be determined to provide a desired current. Or stated in another manner, by regulating the heat ranges of the components forming the thermocouples in the low temperature stage to utilize substantially all the heat remaining after passage through the high temperature stage, a greater choice of metals for the high temperature stage is available.

Figure 2:
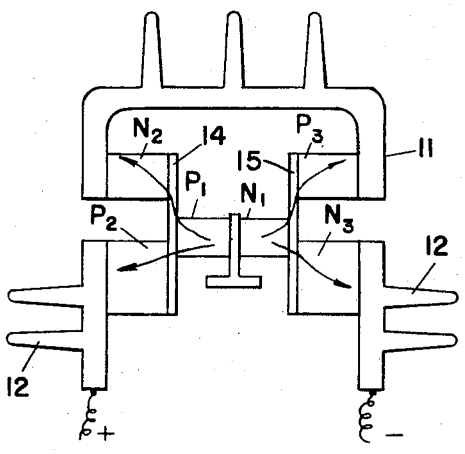
FIGURE 2 is a schematic view of the circuit of FIGURE 1 to show the heat flow.

In FIGURE 2, the heat flow is as shown by the arrowed lines. Heat is supplied to the central copper bar 13 from a source indicated at 20 in FIGURE 1 and flows in both directions through the higher temperature metals $P_1$–$N_1$ and branches through each of the lower temperature metals $P_2$–$N_2$ and $P_3$–$N_3$.

Figure 3:
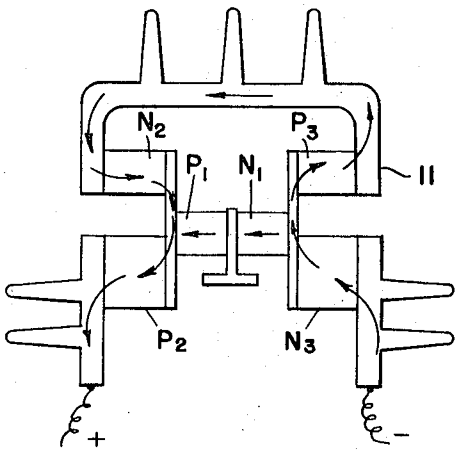
FIGURE 3 is another schematic view of the circuit of FIGURE 1 to show the current flow.

In FIGURE 3, the current flow is shown by the arrowed lines. The flow is from the negative side $N_1$ through $P_1$ in the high temperature stage and $N_3$ of the low temperature stage through $P_3$ heat sink 11, through $N_2$ and current from both stages flows through $P_2$ to the positive side providing any additive or cumulative current conversion from both the high and the lower temperature stages. The circuit through heat sink 11 and parallel to thermocouple $P_1$–$N_1$ allows the higher resistance of thermocouple $P_1$–$N_1$, due to its large ratio of length to cross sectional area, to be bypassed by the current generated by thermocouples $P_2$–$N_2$ and $P_3$–$N_3$. Thus a compatible design has been achieved which allows the length to area ratios to be selected for maximum efficiency without a corresponding decrease in efficiency due to the relatively higher resistance of the component or thermocouple with the highest length to area ratio.

Obviously many modifications and variations of the present invention are possible in the light of the above teachings. It is therefore to be understood that, within the scope of the appended claim, the invention may be practiced otherwise than as specifically described.

I claim:

A thermoelectric device providing continuity of electrical and thermal flow over a wide temperature range which comprises, (a) a first thermocouple formed of thermoelectric elements which are constructed of metals for operating effectively at the higher stage of the temperature range, (b) each thermoelectric element having two ends and the elements being disposed in spaced relation providing a pair of adjacent ends and a pair of remote ends, (c) a heat input conductor disposed centrally of and interconnecting said adjacent ends, (d) a first thermal and electrical conductor connected generally perpendicular to one of said remote ends and a second thermal and electrical conductor connected generally perpendicular to the other of said remote ends, (e) a second and a third thermocouple each being formed of thermoelectric elements which are constructed of metals for operating effectively at a lower stage of the temperature range, (f) each thermoelectric element of the second thermocouple having two ends and the elements being disposed in spaced relation providing a pair of adjacent ends and a pair of remote ends, (g) said adjacent ends of said second thermocouple being connected generally perpendicular to said first thermal and electric conductor, (h) each thermoelectric element of the third thermocouple having two ends and the elements being disposed in spaced relation providing a pair of adjacent ends and a pair of remote ends, (i) said adjacent ends of said third thermocouple being connected generally perpendicular to said second thermal and electric conductor and (j) a third thermal and electrical conductor bridging one element of each of said second and third thermocouples and providing a common heat sink and, (k) the dissimilar metals of said second and third thermocouples being formed to have different ratios between their lengths and cross sections and the dissimilar metals of the first thermocouple being formed to have a greater ratio between its length and cross section than the ratios of the dissimilar metals of said second and third thermocouples.

References Cited

UNITED STATES PATENTS

| | | | |
|---|---|---|---|
| 3,074,242 | 1/1963 | Lindenblad ______ | 136—203 X |
| 3,125,860 | 3/1964 | Reich ___________ | 136—203 X |
| 3,291,648 | 12/1966 | Sheard et al. ________ | 136—212 |

FOREIGN PATENTS

| | | |
|---|---|---|
| 1,163,415 | 2/1964 | Germany. |

OTHER REFERENCES

Angello et al., in Thermoelectricity: Sci. and Eng., Heikes et al., Intersci. Pub., New York, 1961, pg. III and 536–545.

Harman, J. Appl. Phys., vol. 29 (October 1958), pg. 1471–1473.

O'Brien et al., J. Appl. Phys., 27 (July 1956), pp. 820–823.

Ure et al., in Thermoelectricity: Sci. and Eng., op. cit., pp. III, 458, 482–487, 488–493 and 517.

WINSTON A. DOUGLAS, *Primary Examiner.*

A. M. BEKELMAN, *Assistant Examiner.*